(12) United States Patent
Decker et al.

(10) Patent No.: US 7,709,820 B2
(45) Date of Patent: May 4, 2010

(54) RADIATION WINDOW WITH COATED SILICON SUPPORT STRUCTURE

(75) Inventors: Keith W. Decker, Pleasant Grove, UT (US); Mike Lines, Cedar Hills, UT (US); Degao Xu, Provo, UT (US); Raymond Perkins, Orem, UT (US)

(73) Assignee: Moxtek, Inc., Orem, UT (US)

( * ) Notice: Subject to any disclaimer, the term of this patent is extended or adjusted under 35 U.S.C. 154(b) by 149 days.

(21) Appl. No.: 12/124,917

(22) Filed: May 21, 2008

(65) Prior Publication Data
US 2009/0173897 A1 Jul. 9, 2009

Related U.S. Application Data

(63) Continuation-in-part of application No. 11/756,946, filed on Jun. 1, 2007.

(51) Int. Cl.
*H01J 37/252* (2006.01)
(52) U.S. Cl. .................... 250/505.1; 250/310
(58) Field of Classification Search .............. 250/505.1, 250/310
See application file for complete search history.

(56) References Cited

U.S. PATENT DOCUMENTS

| | | | |
|---|---|---|---|
| 3,828,190 A | 8/1974 | Dahlin et al. |
| 4,178,509 A | 12/1979 | More et al. |
| 4,393,127 A | 7/1983 | Greschner et al. |
| 4,532,150 A | 7/1985 | Endo et al. |
| 4,591,756 A | 5/1986 | Avnery |
| 4,608,326 A | 8/1986 | Neukermans et al. |
| 4,645,977 A | 2/1987 | Kurokawa et al. |
| 4,862,490 A | 8/1989 | Karnezos et al. |
| 4,933,557 A | 6/1990 | Perkins |
| 4,939,763 A | 7/1990 | Pinneo et al. |
| 4,957,773 A | 9/1990 | Spencer et al. |
| 4,960,486 A | 10/1990 | Perkins et al. |
| 5,173,612 A | 12/1992 | Imai et al. |
| 5,217,817 A | 6/1993 | Verspui et al. |
| 5,258,091 A | 11/1993 | Imai et al. |
| 5,432,003 A | 7/1995 | Plano et al. |
| 5,571,616 A | 11/1996 | Phillips et al. |
| 5,578,360 A | 11/1996 | Viitanen |
| 5,607,723 A | 3/1997 | Plano et al. |

(Continued)

FOREIGN PATENT DOCUMENTS

JP 3170673 7/1991

(Continued)

OTHER PUBLICATIONS

Sheather Journal Physil 1973, pp. 319-322, vol. 6, No. 4.

(Continued)

*Primary Examiner*—Kiet T Nguyen
(74) *Attorney, Agent, or Firm*—Thorpe North & Western LLP

(57) ABSTRACT

A window for a radiation detection system includes a frame with an aperture therein configured to receive radiation therethrough. A plurality of silicon ribs span the aperture and are carried by the frame. A coating substantially envelopes each of the plurality of silicon ribs. A thin film covers the aperture and is carried by the plurality of silicon ribs and is configured to pass radiation therethrough.

19 Claims, 5 Drawing Sheets

U.S. PATENT DOCUMENTS

| | | | |
|---|---|---|---|
| 6,002,202 | A | 12/1999 | Meyer et al. |
| 6,740,874 | B2 | 5/2004 | Doring |
| 6,803,570 | B1 * | 10/2004 | Bryson, III et al. ......... 250/305 |
| 6,852,365 | B2 | 2/2005 | Smart et al. |
| 6,956,706 | B2 | 10/2005 | Brandon |
| 7,358,593 | B2 * | 4/2008 | Smith et al. ................. 257/619 |
| 2003/0152700 | A1 | 8/2003 | Asmussen et al. |
| 2008/0296479 | A1 | 12/2008 | Anderson et al. |
| 2008/0296518 | A1 | 12/2008 | Xu et al. |

FOREIGN PATENT DOCUMENTS

| | | |
|---|---|---|
| JP | 6289145 | 10/1994 |

OTHER PUBLICATIONS

Degau Xu, U.S. Appl. No. 11/756,946, filed Jun. 1, 2007.

Viitanen Veli-Pekka et al., Comparison of Ultrathin X-Ray Window Designs, presented at the Soft X-rays in the 21st Century Conference held in Provo, utah Feb. 10-13, 1993, pp. 182-190.

Scholze et al., "Detection efficiency of energy-dispersive detectors with low-energy windows" X-Ray Spectrometry, X-Ray Spectrom, 2005: 34: 473-476.

Panayiotatos, et al., "Mechanical performance and growth characteristics of boron nitride films with respect to their optical, compositional properties and density," Surface and Coatings Technology, 151-152 (2002) 155-159.

www.moxtek,com, Moxtek, Sealed Proportional Counter X-Ray Windows, Oct. 2007, 3 pages.

www.moxtek.com, Moxtek, AP3 Windows, Ultra-thin Polymer X-Ray Windows, Sep. 2006, 2 pages.

www.moxtek.com, Moxtek, DuraBeryllium X-Ray Windows, May 2007, 2 pages.

www.moxtek.com, Moxtek, ProLine Series 10 Windows, Ultra-thin Polymer X-Ray Windows, Sep. 2006, 2 pages.

www.moxtek.com, Moxtek, ProLine series 20 Windows, Ultra-thin Polymer X-Ray Windows, Sep. 2006, 2 pages.

Tien-Hui Lin et al., "An investigation on the films used as the windows of ultra-soft X-ray counters." Acta Physica Sinica, vol. 27, No. 3, pp. 276-283. May 1978, abstract only.

Anderson, et al., U.S. Appl. No. 11/756,962, filed Jun. 1, 2007.

* cited by examiner

RADIATION WINDOW WITH COATED SILICON SUPPORT STRUCTURE

PRIORITY CLAIM

This is a continuation-in-part of U.S. patent application Ser. No. 11/756,946, filed Jun. 1, 2007; which is herein incorporated by reference.

RELATED APPLICATIONS

The present application is related to copending U.S. patent application Ser. No. 11/756,962, filed Jun. 1, 2007; which is herein incorporated by reference.

BACKGROUND

1. Field of the Invention

The present invention relates generally to X-ray windows with coated silicon or silicon-compound support structures.

2. Related Art

Radiation windows are used in radiation-detection systems, which in turn are used in detecting and sensing emitted radiation in connection with electron microscopy, X-ray telescopy, and X-ray spectroscopy. Radiation-detection systems typically include in their structure a radiation window, which can pass radiation emitted from the radiation source to a radiation detector or sensor. The radiation detection system's design constraints define the radiation window's performance requirements.

A radiation window's performance is measured in part by its ability to transmit lower-energy X-rays while still being able to withstand a pressure differential with minimal or undetectable vacuum leak rates. Standard radiation windows typically comprise a sheet of material placed over an opening or entrance to the detector. As a general rule, the sheet-material's thickness, density, and mass absorption coefficient correspond directly to its ability to pass radiation. The most desirable materials for maximizing radiation transmission include the least dense and lowest mass-absorption coefficient materials which are typically the lowest atomic-mass elements. It is also desirable to provide a sheet of material that is as thin as possible, yet capable of withstanding cracks, pinhole voids or other breaks leading to leakage resulting from gravity, vibration, normal wear and tear, and differential pressure. It is also desirable in many applications to block visible light. Veli-Pekka et al. in "Comparison of Ultrathin X-Ray Window Designs" compare the radiation transmission performance and leak-rate performance of several materials and sheet-material configurations. The authors note that "windows which do not have to withstand atmospheric pressures can be supported by a polyimide grid" but further clarify that "by using a separate tungsten support grid as an additional support, the polymer grid supported windows also can be made pressure tolerant." See Viitatanen, Veli-Pekka et al., "Comparison of Ultrathin X-Ray Window Designs," *Journal of X-Ray Science and Technology* 4, (1994): 182-190.

As Veli-Pekka et al. note the need to minimize thickness in the membranes used to pass radiation they suggest a solution to support the thin sheet of material with a tungsten grid support structure. Known support structures include frames, screens, meshes, ribs, and grids. While useful for providing support to an often thin and fragile sheet of material, many support structures can interfere with the passage of radiation through the window assembly due to the structure's composition, geometry, thickness, and/or height.

Higher atomic-mass elements used in the radiation window's sheet material and support structure composition often cause spectral contamination when used in X-ray spectrometry or fluorescence-type applications. In X-ray fluorescence spectrometry, photonic radiation from a primary radiation source irradiates the atoms of a specimen, expelling electrons from the atoms' inner-orbital shells creating shell vacancies. Outer-orbital electrons "fall" into the inner-orbital shell vacancies emitting secondary radiation equal to the difference in energy between the outer and inner shells. This discrete emitted radiation, or spectral emission, is unique to the fluoresced element and is measured in electron volts (eV). A radiation detector converts the discrete spectral emissions into a voltage signal which is then fed into a pulse processor and multi-channel analyzer. The pulse processor and multi-channel analyzer produce a histogram to rank and quantify the distinct energy values emitted from the specimen. As each photon (secondary radiation) is received into the radiation-detector sensor, the photon's energy (eV) is measured and a count is placed in an energy "bin" corresponding to its value. Photons with identical energy values are counted into the bin. The more counts a specific bin receives, the more prevalent the corresponding element is in the specimen. The result is a series of Gaussian (bell-curve) peaks, displayed on a software-generated graph, corresponding to the elemental composition of the specimen. An energy-dispersive detector is said to have high resolution when it is able to readily distinguish between the spectral counts (or photonic energy eV counts) to produce well-defined Gaussian peaks representing the elements comprising the specimen. Detector resolution is defined as the fall-width eV span at half the maximum height of a known Gaussian curve (FWHM).

Good spectral resolution is more difficult to achieve when measuring a specimen comprised of lower atomic-number elements. Secondary radiation from low atomic-number elements, referred to as soft X-rays and measured by the energy-dispersive detector, is low in energy and thus more easily absorbed by the detector's radiation window and window support structure. If absorbed, the energy is not received by the radiation-detector sensor and thus not counted by the pulse processor and multi-channel analyzer, creating an erroneous composition calculation.

Spectral energy or radiation from a fluoresced specimen may in turn fluoresce the radiation window's components creating a tertiary radiation. The tertiary radiation enters the sensor as the characteristic radiation of the window's components instead of the specimen's characteristic radiation. The result is the confounding of the specimen's spectral energy into unknown or other elements' spectral-emission lines, called 'stray lines.' This tertiary fluorescence mixes with and contaminates the specimen's emission signal causing the detector to erroneously calculate the sample's elemental composition. This is especially true if the radiation window's sheet material and support structure composition comprise higher-atomic number elements or if the detector is used "to detect minute concentrations of trace elements." (See F Scholze and M. Procop, "Detection efficiency of energy-dispersive detectors with low-energy windows," *X-Ray Spectrum* 34, (2005): 473-76.) For these reasons, using the lowest atomic-mass elements in the radiation window's sheet material and support structure composition provides the best radiation window suitable for high-performance energy-dispersive radiation detectors.

The window material is typically very thin and flexible and requires a support structure to span the window-opening area. The support structure thickness also plays an important role in optimizing radiation transmission. For example, in energy-dispersive radiation-detector applications, the fluoresced specimen under examination emits radiation in all directions. Typically, the specimen, the radiation detector window, and the detector sensor are located as close as possible to each other to decrease radiation travel distance and increase the amount of radiation entering the detector sensor. Only photons traveling in a direct line-of-sight between the fluoresced element and the radiation detection sensor will enter the sensor without hitting the support structure's ribs or grid sides. If the radiation window's support structure is excessively tall, a significant portion of radiation will be absorbed into the ribs' side walls, effectively collimating radiation that would otherwise be measured. Decreasing the support structure's height increases the line-of-sight opening between the radiation source and the sensor. In X-ray spectrometry applications, reduced-height support structures minimize radiation collimation, increase radiation flux, and thus decrease sensor reading times.

Silicon can be an ideal material for use as a radiation window's support structure because silicon is a low atomic-mass element that minimizes spectral contamination. Silicon is also ideal because it is easy to etch suitable window frames with well-defined edges and flat sidewalls using established etching techniques. However, silicon is a brittle and relatively weak material for use as a structural support member. The radiation window support structure must be sufficiently robust to withstand pressure differentials and vibration which occur under normal use. The radiation window is a comparatively inexpensive part of the radiation detector assembly but the radiation window's failure may result in catastrophic damage and require total replacement of the radiation detector.

It has been proposed to strengthen silicon needles by growing and later removing a silicon-oxide layer in order to provide a smoother surface with fewer defects, where the surface defects would otherwise initiate microcracks and thus decrease fracture toughness. See Smart et al in U.S. Pat. No. 6,852,365.

It has been proposed to dope a silicon substrate with boron as part of an etching process. See U.S. Pat. No. 4,960,486.

The radiation-window support-structure geometry contributes significantly to its ability to transmit radiation. Support-structure geometry defines the number of ribs or grid density as well as the width of the individual ribs or grid walls. Higher-frequency rib count, higher-grid density, or wide grid-wall structures decrease the amount of unobstructed open area, which decreases radiation transmission. The need for increased structure-free window area should be balanced with the need to support stretchy polymer-based window film. Support ribs spaced too far apart or grid density that is too low may cause unacceptable window-film deflection when the window must withstand a pressure differential.

SUMMARY

It has been recognized that it would be advantageous to develop a radiation-window with a support structure that maximizes radiation transmission; is sufficiently robust to withstand gravity, vibration, normal wear and tear, and differential pressure; minimizes spectral contamination; reduces collimation; and makes use of manufacturing processes and materials that provide suitable production yields. It has been recognized that it would be advantageous to strengthen the brittle silicon support frame without using higher atomic-mass elements. It has been recognized that it is possible to further strengthen the silicon structure by introducing low atomic-mass elements or compounds as surface coatings, and diffusing the coatings into the silicon structure to create stronger silicon-based compounds or alloys. The present invention provides a high-strength window for a radiation-detection system. A window for a radiation-detection system includes a plurality of ribs carried by a frame having an aperture therein. The ribs are made of silicon. A coating substantially envelopes each of the plurality of silicon ribs, A thin film covers the aperture and is carried by the plurality of silicon ribs and configured to pass radiation therethrough.

There has thus been outlined, rather broadly, various features of the invention so that the detailed description thereof that follows may be better understood, and so that the present contribution to the art may be better appreciated. Other features of the present invention will become clearer from the following detailed description of the invention, taken together with the accompanying claims and drawing, or may be learned by the practice of the invention. The drawings are not to scale.

DETAILED DESCRIPTION

Figure 1A:
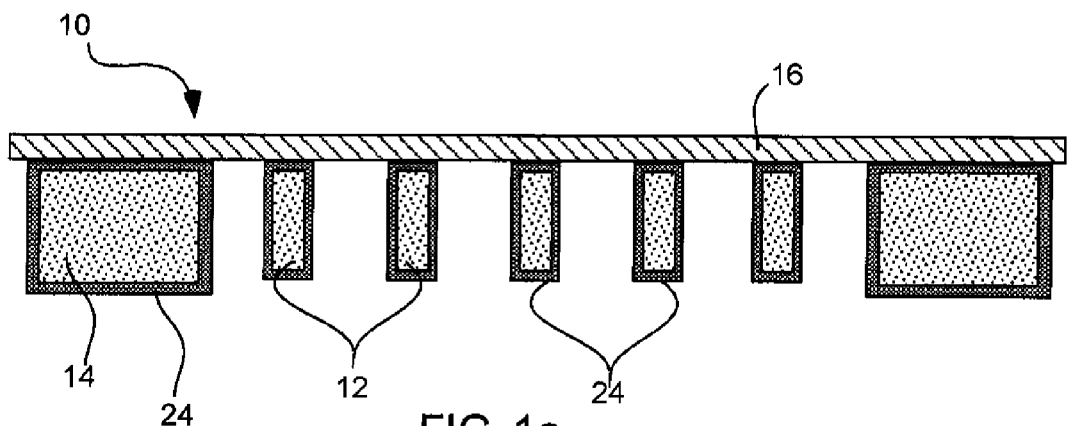
FIG. 1a is a cross-sectional side view of a window in accordance with an embodiment of the present invention comprising coated silicon ribs.

Reference will now be made to the exemplary embodiments illustrated in the drawings, and specific language will be used herein to describe the same. It will nevertheless be understood that no limitation of the scope of the invention is thereby intended. Alterations and further modifications of the inventive features illustrated herein, and additional applications of the principles of the inventions as illustrated herein, which would occur to one skilled in the relevant art and having possession of this disclosure, are to be considered within the scope of the invention.

The present invention provides embodiments of a high strength window for a radiation detection system, an associated radiation detection system, and an associated method of manufacturing a high strength grid for a window in a radiation detection system. In accordance with these embodiments, various details are provided herein which are applicable to all three of the window, system and manufacturing method.

Figure 1B:
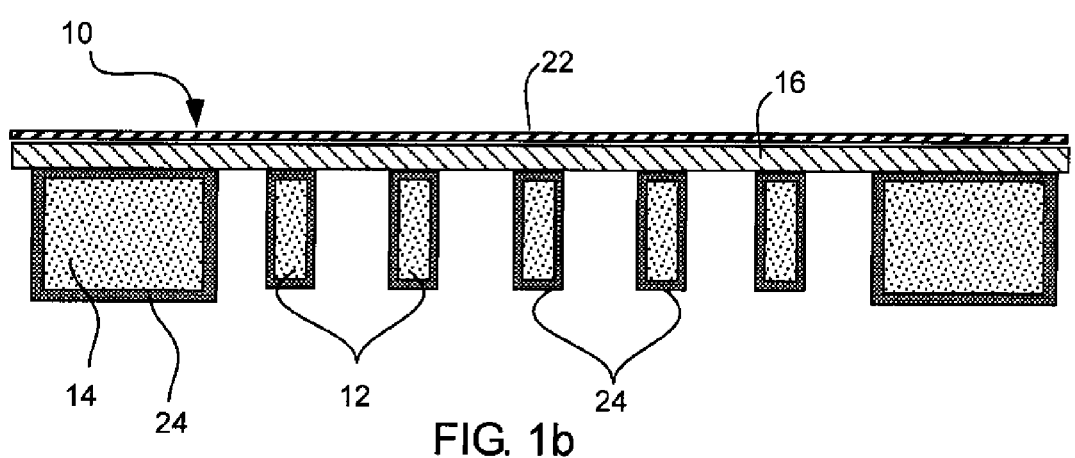
FIG. 1b is a cross-sectional side view of another window in accordance with another embodiment of the present invention comprising coated silicon ribs and a gas barrier.
Figure 2A:
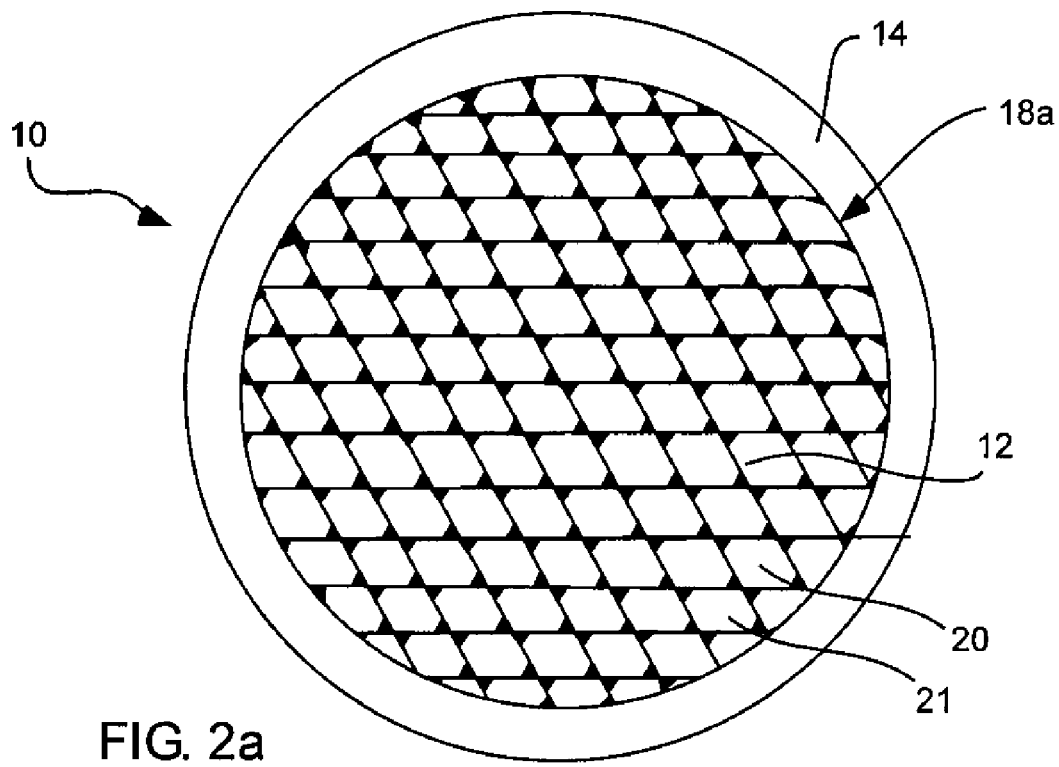
FIG. 2a is a top view of an embodiment of a support grid of the high strength window of FIG. 1a-b.
Figure 2B:
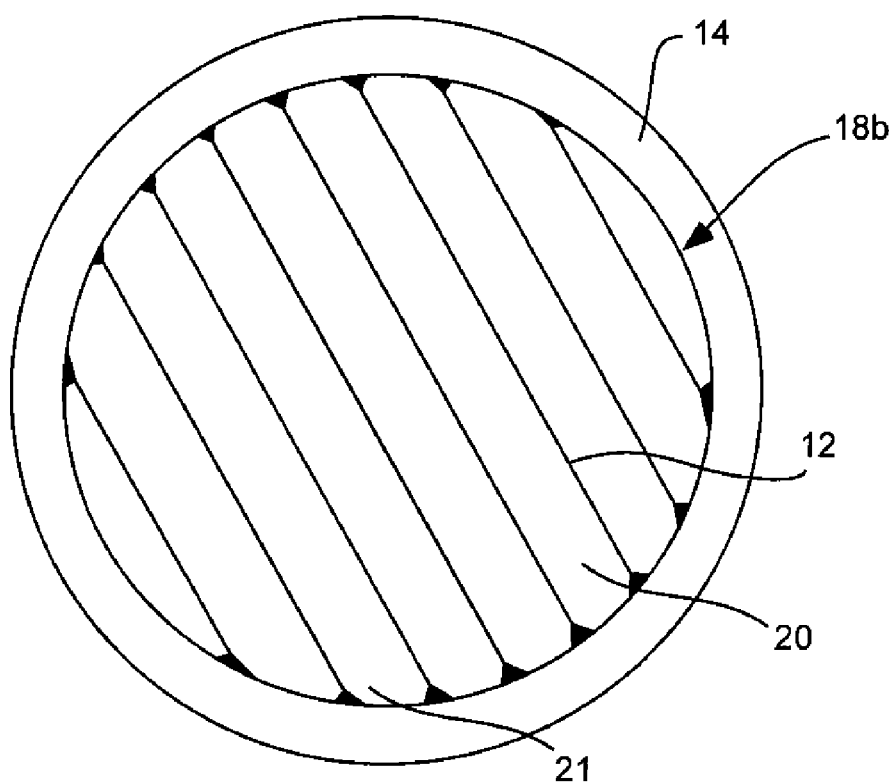
FIG. 2b is a top view of another embodiment of a support grid of the high strength window of FIG. 1a-b.
Figure 3:
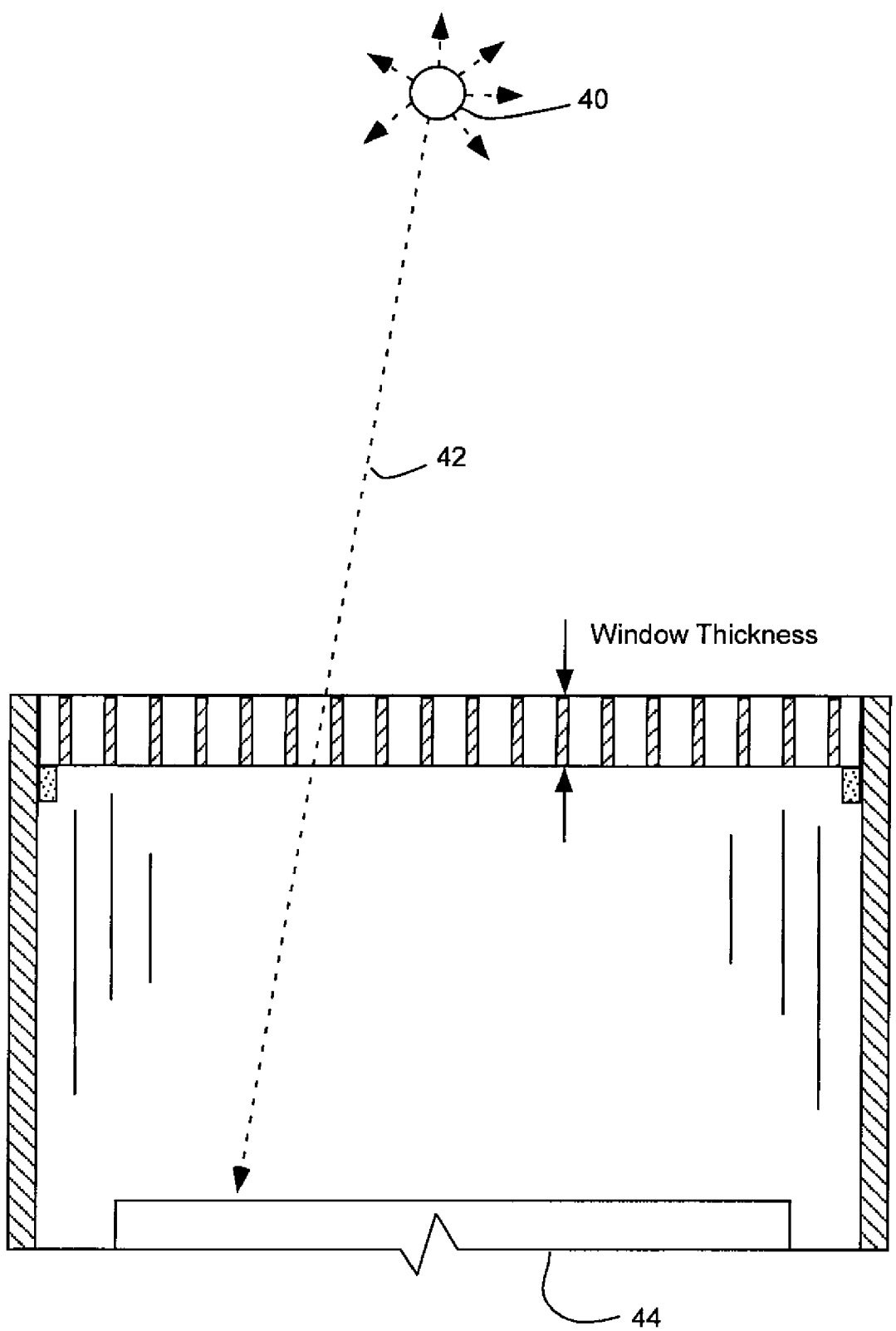
FIG. 3 is a cross-sectional schematic view of a prior art x-ray detector system.
Figure 4:
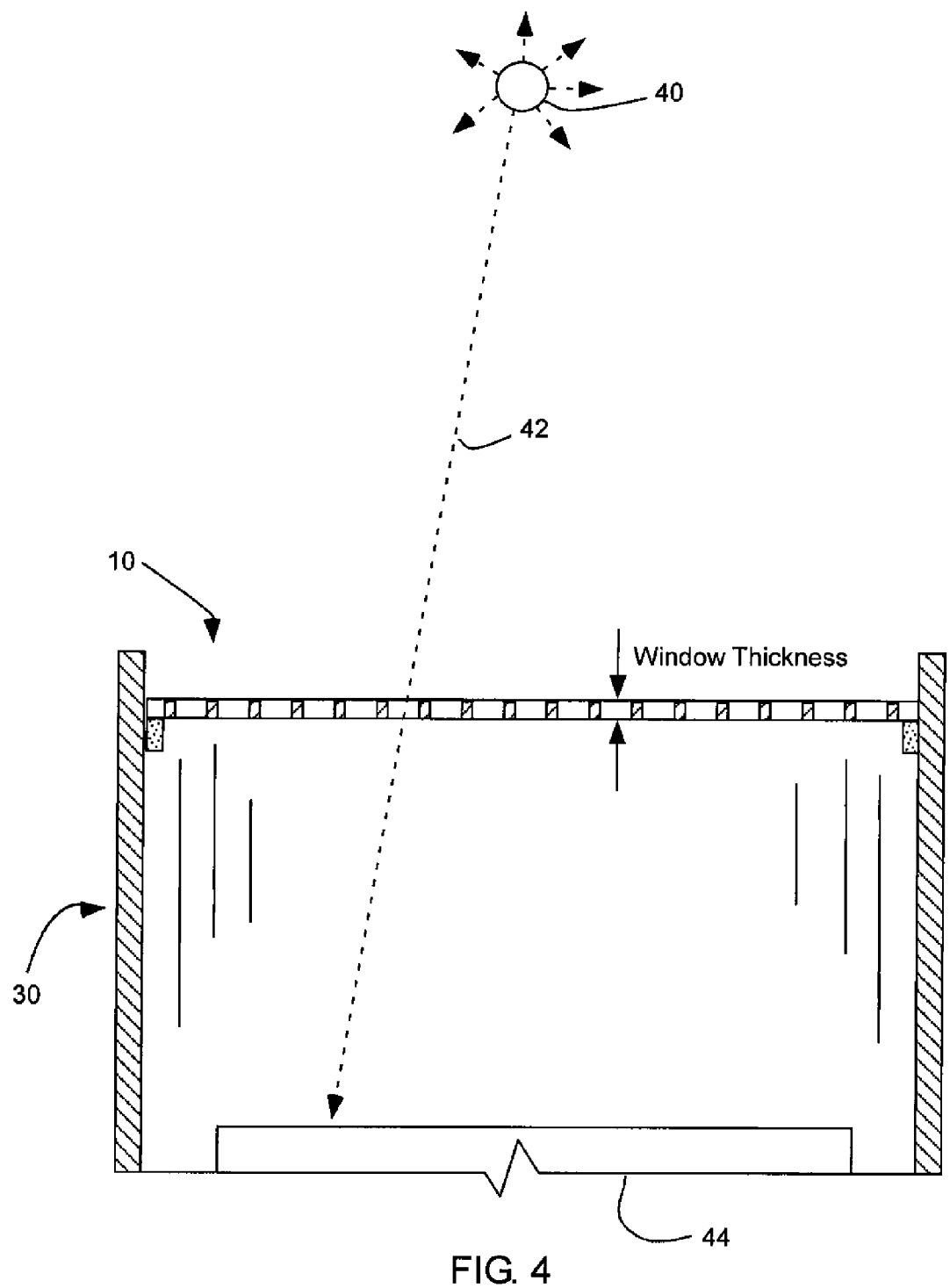
FIG. 4 is a cross-sectional schematic view of an x-ray detector system in accordance with an embodiment of the present invention as shown in FIG. 1a-b.

As illustrated in FIGS. 1a-b, a high strength window, indicated generally at 10, is shown in accordance with an exemplary embodiment of the present invention. Specifically, the window 10 is configured for use in connection with a radiation detection system 30 (FIG. 4). The window and associated radiation detection system can be useful for a variety of applications including those associated with electron microscopy, X-ray telescopy, and X-ray spectroscopy. In use, radiation in the form of high energy photons (indicated by line 42 in FIG. 3 and FIG. 4) can be directed toward the window of the radiation detection system. The window receives and passes radiation therethrough. Radiation that is passed through the window reaches a sensor 44 (FIG. 3 and FIG. 4), which generates a signal indicating the type and amount of radiation the sensor receives. The window can be round, as shown in FIG. 2a-b, or the window can be oval (not shown).

As described above, the window 10 can be subjected to a variety of operating and environmental conditions, including for example, reduced or elevated pressures, a substantial vacuum, contamination, etc. Such conditions tend to motivate thicker, more robust windows. Radiation detection systems, however, can potentially be used to sense or detect limited or weak sources. In addition, certain applications require or demand precise measurements. Such systems or applications tend to motivate thinner windows. Support ribs 12 can span the window 10 to provide support to thinner window films 16. The support itself can interfere with the incoming radiation directly or even re-radiate, introducing spectral contamination leading to instrumentation errors. In addition, difficulty can arise in the manufacture of these supports, thus making these support structures costly. Therefore, it has been recognized that it would be advantageous to develop an economical window that is as thin as possible (to resist spectral contamination and radiation absorption) yet as strong as possible.

The window 10 of the present invention has a plurality of intersecting ribs 12 (FIG. 2a) or parallel ribs 12 (FIG. 2b) defining a grid, 18a or 18b, having openings 20 therein, and a support frame 14 around the perimeter of the plurality of ribs. The support frame 14 has an aperture 21 through which radiation can pass. The support frame carries and supports the ribs which span the aperture. The window also has a thin film 16 (FIGS. 1a and 1b) disposed over and spanning the plurality of ribs and openings. The window 10 may include an additional gas barrier film or films 22 (FIG. 1b). This film 16 is configured to pass radiation therethrough.

The support frame 14 can be made of the same material as the plurality of ribs 12 defining the grid 18a or 18b. Accordingly, both the ribs and support frame can be or include a silicon material, although this is not required. According to one aspect, the support frame can be integral with the grid. In this case, both the support frame and grid can be formed from a single piece of material by removing or etching the openings 20 in the grid to leave the ribs joined at their ends to the support frame. Alternatively, the support frame can form a separate piece that can be coupled to the grid by an adhesive. By being connected, the support frame 14 serves to further strengthen the plurality of ribs 12. In addition to providing support for the grid and the layer of thin polymer film 16, the support frame 14 can be configured to secure the window 10 to the appropriate location on a radiation detection system. Each rib comprising the plurality of ribs can be less than 100 μm wide but may preferably be thinner depending on the window's longest rib span and rib height. The rib span is the length of one rib spanning the aperture of the support frame.

A coating 24 substantially envelopes each rib 12 and the support frame 14, and further strengthens each rib. The coating can surround a cross-sectional perimeter of the ribs, including the sides, bottom and top of the rib between the rib and the film. The coating 24 is not necessary to strengthen the support frame but is instead applied to both the support frame and ribs for ease of manufacturing. After the coating 24 has been applied, a film 16 is disposed over and spanning the plurality of ribs 12 and openings 20. The film is configured to pass radiation therethrough. The rib coating 24 substantially envelops the individual ribs but does not coat the window film 16 as additional coatings on the window film unnecessarily absorb radiation passing therethrough.

Figure 1C:
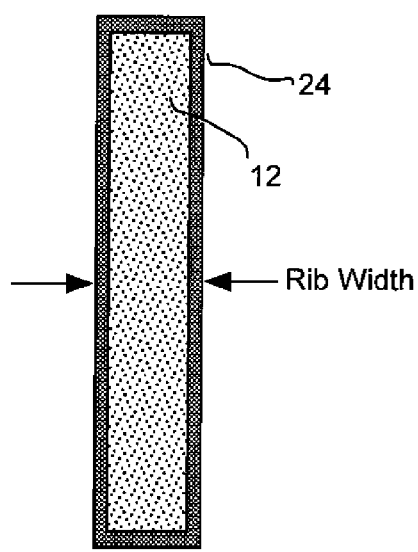
FIG. 1c is a cross-sectional side view of an individual coated-silicon rib.
Figure 1D:
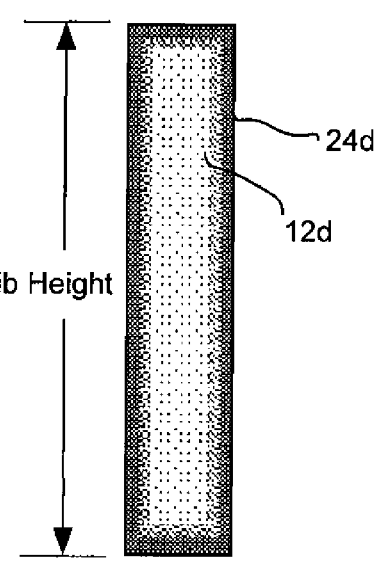
FIG. 1d is a cross-sectional side view of an individual coated-silicon rib wherein the coating has diffused into the silicon rib forming a silicon-based compound.

The rib coating 24 may itself provide sufficient strengthening benefits to the rib frame structure; however, in one embodiment of the present invention, the coating 24d is diffused into the individual ribs 12d, forming a silicon-based compound or alloy that further strengthens the rib frame (FIG. 1d).

For optimum spectral-contamination avoidance, the ribs may be coated with a low-atomic mass element (in one aspect less than 28 grams/mol) or elements that also increase the ribs' strength. These elements include, but are not limited to, carbon-based materials such as SiC or diamond, metal materials such as Beryllium, Magnesium, or Aluminum, non-metals such as Boron, and compounds such as Boron Carbide, Boron Nitride, Silicon Nitride, or Beryllium Oxide. Again, the coating 24 may remain substantially on the ribs' surfaces (FIG. 1c) or the coating 24d may diffuse into the ribs' structures (FIG. 1d) forming new compounds.

Coated-silicon ribs provide several advantages over substantially pure or uncoated-silicon ribs. Coated-silicon ribs provide better strength and rigidity and reduce brittleness associated with pure silicon. These features allow the rib cross-section to be minimized creating an optimum grid-free opening in the radiation window. A substantially coated silicon rib is stronger than an uncoated silicon rib. The plurality of silicon ribs with a coating substantially enveloping each rib has an equal strength or a greater strength, and ribs with less cross section or fewer ribs, than a plurality of un-coated ribs with more ribs or wider cross section. A fortified silicon rib with a slender cross-section will reduce radiation absorption and spectral contamination. The coated silicon ribs' height may also be minimized. The ribs of the present invention can have a height less than approximately 100 μm.

The resulting fortified silicon-rib support structure is different from traditionally doped silicon support structures. Silicon doping in semiconductor processes may be described as light or heavy, where "light doping" is defined as introducing on the order of one (1) impurity atom for every 100,000,000 silicon atoms and "heavy doping" is defined as introducing on the order of one (1) impurity atom for every 10,000 silicon atoms. The fortified rib structures described in embodiments of the present invention include much higher 'impurity' concentrations so as to form new silicon-based compounds or alloys. Accordingly, the diffused impurity-to-silicon atomic ratio may be one-to-one, one-to-several, or several-to-one depending on the compounds formed within the rib structure.

Fortified silicon support structures are stronger than traditional pure or doped silicon support structures in part because some of the materials comprising the coating are stronger than pure or doped silicon. For example, the modulus of elasticity of SiC is approximately 460 GPa and its compressive yield strength can be as high as 4600 MPa if properly processed. Similarly, diamond's modulus of elasticity is approximately 5,000 GPa and its compressive yield strength is 10,000 MPa. In contrast, silicon's modulus of elasticity is 112 GPa and its compressive yield strength is 120 MPa. Another reason fortified silicon support structures are stronger is that the coating and diffusion processes modify the silicon's atomic lattice structure for increased compressive and tensile strength.

A preferred design optimizes the ribs' spatial orientation and interconnection scheme to increase the window's open area unobstructed by the support structure. Reducing the support structure's cross-sectional area and height increases unobstructed area. In one embodiment, the rib cross-sectional width is 60 μm and the rib height is 100 μm. In contrast, previous designs necessitated rib height of at least 381 μm when combined with a similar rib cross-sectional width and similar window area. The ribs may be oriented substantially parallel with respect to each other and define openings. Drawbacks associated with the unidirectional ribs may be overcome by adding fillets to at least one corner of an opening or otherwise rounding or blunting sharp corners or edges. Creating fillets, rounding corners, or filling edges may be done by etching the frame structure into the preferred shape or by coating the already-etched frame. The fillets may be located at the rib-frame connections. In another embodiment, the ribs may intersect with each other. This embodiment may also incorporate fillets and rounded corners with the fillets additionally located at the inter-rib connections.

The film disposed over and spanning the plurality of ribs and openings may be a polymeric film. The film may further comprise a gas barrier film to prevent or limit leakage when a pressure differential exists across the window. The gas barrier film may be aluminum or boron. The window film is sufficiently thick to optimize the amount of open area, or window area not blocked by the under-supporting frame. Thinner window films, especially those made from silicon-based compounds, may require an increased frame-obstructed proportion by either increasing each individual rib's width or the rib period. In one embodiment of the present invention, the polymeric film is 0.3 μm thick. When the polymeric film is combined with the strengthened support structure, the total fraction of open area has been demonstrated to be as much as 75, 80, 85, or 90% of the total window area.

Some low atomic-mass strengthening elements, when coated and diffused into silicon, provide greater material strength than other low atomic-mass strengthening elements, Table 1 lists the compressive yield strength and modulus of elasticity for various low atomic-mass materials.

TABLE 1

Material Properties of Potential Coatings

| | Material | Compressive Yield Strength | Modulus of Elasticity |
|---|---|---|---|
| Base Material | Silicon | 120 MPa | 112 GPa |
| Carbon-based | SiC | 345-4600 MPa | 460 GPa |
| | Carbon (Diamond) | 8680-16530 MPa | 700-1200 GPa |
| | Carbon (Graphite) | 86.5 MPa | 4.8 GPa |
| Metal-based | Be | 270 MPa | 303 GPa |
| | Magnesium | 21.0 MPa | 44.0 GPa |
| | Aluminum | 15-20 MPa | 68.0 GPa |
| Non-Metal or Compound-based | Boron | <0.5 MPa | .440 GPa |
| | Boron Carbide | 400 MPa | 460 GPa |
| | Boron Nitride | 41.0-317 MPa | 41.0-97.0 GPa |
| | Silicon Nitride | 520 MPa | 96.0-220 GPa |
| | Beryllium Oxide | 2068 MPa | 345 GPa |
| | $SiO_2$ (Fused Silica) | 1100 MPa | 70.0-78.0 GPa |
| | $SiO_2$ (Quartz) | 1100 MPa | 68.0 GPa |

Several coatings may increase the mechanical strength of the silicon-based material because of their inherent strength and may also increase the silicon-structure strength through other means. For example, several coatings will reduce surface defects such as cracks or voids to improve the structure's overall fracture resistance. A preferred embodiment combines both the surface treatment to minimize defects and the material strengthening properties of the greater compressive yield strength and modulus of elasticity materials.

The thin film 16 is disposed over and spans the plurality of ribs 12 and openings 20. The film can be selected to be highly transmissive of X-rays, for example, and of X-rays having energies greater than 100 electron volts, while blocking visible light energy and other unwanted radiation. In addition, the film can be selected to withstand fluid pressures of up to one atmosphere (caused by housing the detector in a vacuum environment behind the X-ray window) without breaking so that fluid may not penetrate the window.

The thin film can include a layer of polymer material, such as poly-vinyl formal (FORMVAR), butvar, parylene, kevlar, polypropylene, lexan or polyimide. Nonpolymer materials such as boron, carbon (including cubic amorphous and forms containing hydrogen), silicon, silicon nitride, silicon carbide, boron nitride, aluminum and beryllium could also be used. In one aspect, the film can include doped silicon. Desirably, the film should be configured to avoid punctures, uneven stretching and localized weakening. To reduce the chance of damage that can result to the thin film 16 overlaying the grid 18, the top edges of the ribs 12 can be rounded and/or polished to eliminate sharp corners and rough surfaces which might otherwise cause damage. In one aspect, forming the ribs from a single silicon crystal by etching produces the rounded and polished support-structure desired. Alternatively, if other materials and construction methods are used, the tops of the ribs may require rounding and/or polishing via known mechanical and/or chemical processes.

The thin film should be thick enough to withstand operating conditions to which it will be exposed, such as a one-atmosphere pressure-differential, gravity, normal wear and tear and the like. However, as thickness of the layer increases so does undesirable absorption of radiation. If radiation is absorbed by the thin film, it will not reach the sensor or detector. This is particularly true with respect to soft X-rays irradiated from low atomic-mass elements as the X-rays are likely to be absorbed by a thicker film. Therefore, it is desirable to provide a thin film that is as thin as possible but sufficiently thick to withstand the pressures explained above. In one aspect, the film will be able to withstand at least one atmosphere of pressure, and thus the film can have a thickness substantially equal to or less than about 1 μm (1000 nm).

Additional a gas barrier film layers can be disposed over the thin film. Typical gas barrier films include aluminum and boron. Aluminum has the further advantage of blocking visible light.

The material comprising the thin film 16 can be different than the material comprising the ribs 12 and/or support frame 14. Alternatively, all three of the thin film material, ribs and support frame can be or include the same material. According to one embodiment, the thin film, the support frame and the ribs can be integrally formed of the same material. By way of example, and not by way of limitation, silicon may be used for this purpose. In another embodiment, the plurality of ribs can comprise silicon and the thin film material can comprise a polymeric film.

As indicated, the ribs define a grid 18 having openings 20 therein. The tops of the ribs terminate substantially in a common plane. The ribs 12 can include or can be formed entirely of a silicon material in order to provide a high strength support for the thin film while being as thin as possible. For example, the height of the ribs can range from about 100 µm to about 385 µm, and the width of each rib can be about 60 µm. The ribs connect to the outer support frame. In one aspect, the ribs are oriented non-perpendicularly with respect to each other and define non-rectangular openings. Non-rectangular openings can assume a variety of different shapes so long as the ribs defining the openings intersect one another at other than 90 degree angles. The ribs can include a first set of parallel ribs that intersect and are oriented non-orthogonally to a second set of parallel ribs.

According to one embodiment, the openings 20 can be shaped substantially like a hexagon. The openings can also be shaped in the form of a trapezoid, such as a parallelogram. This shape can prevent twisting problems that are commonly associated with unidirectional line ribs which experience maximum stress at the two opposing ends of the longest rib when the window receives a pressure load. When a window incorporating the unidirectional line ribs fails it is usually due to breakage at one or both ends of the longest rib. Mechanical analysis also indicates that many structures incorporating support ribs will twist when a load is applied to the window. This twisting action weakens the rib support structure and the window in general.

The arrangement of ribs 12 and openings 20 in the grid 18 of the present invention can minimize or even prevent the twisting problems experienced in prior teachings. According to one embodiment, at least one corner of each opening includes a fillet that is partially filled with a material, such as the same material as the ribs. The fillet may be located at the rib/support-frame interface or at an inter-rib intersection. By filling the corners, twisting action of the ribs can be further minimized or eliminated altogether. Filling the corners also results in an overall increase in strength of the support grid.

The material used to fill the corners of the openings 20 and the material used to form the ribs 12 can be the same. In one embodiment, this material can be, or can include silicon, although the present invention is not limited to the use of silicon. The ribs can be integrally formed from a single piece of material. Silicon can also be incorporated into this embodiment. Likewise, the ribs and the filled corners can be formed from a single piece of silicon material by removing or etching the openings or cavities. During etching, the manufacture of the ribs and filling of corners can occur substantially simultaneously. Alternatively, the ribs can be formed first and the corners filled thereafter. In this case, the ribs may comprise a material that is not the same as the material used to fill the corners of the openings.

The result of the geometry of the ribs 12 in combination with the filled corners of the openings 20 is that the tolerant strength of the window 10 is increased. By increasing the tolerant strength, it is possible to increase the percentage of open area within the support frame 14 by reducing the number of ribs spanning the window or decreasing the ribs' width. The overall height of the ribs may also be reduced. Each of these options is desirable as each increases the ability of the window to pass radiation.

Specifically, in accordance with the present invention, the openings 20 preferably occupy more area within the perimeter of the support frame 14 than the plurality of ribs 12 or grid. This is due to the fact that the openings will typically absorb less radiation than the surrounding ribs and radiation can more freely pass through the openings than through the ribs. In one aspect, the openings take up between about 75% to about 90% of the total area within the perimeter of the support frame. For example, in one embodiment the openings in the grid comprise at least about 75% of the total area within the perimeter of the support frame and the plurality of ribs comprise no more than about 25% of the total area within the perimeter support frame. Alternatively, the openings can comprise at least about 90% of the total area within the support frame, and the plurality of ribs can comprise no more than about 10% of the total area within the frame.

Figure 5:
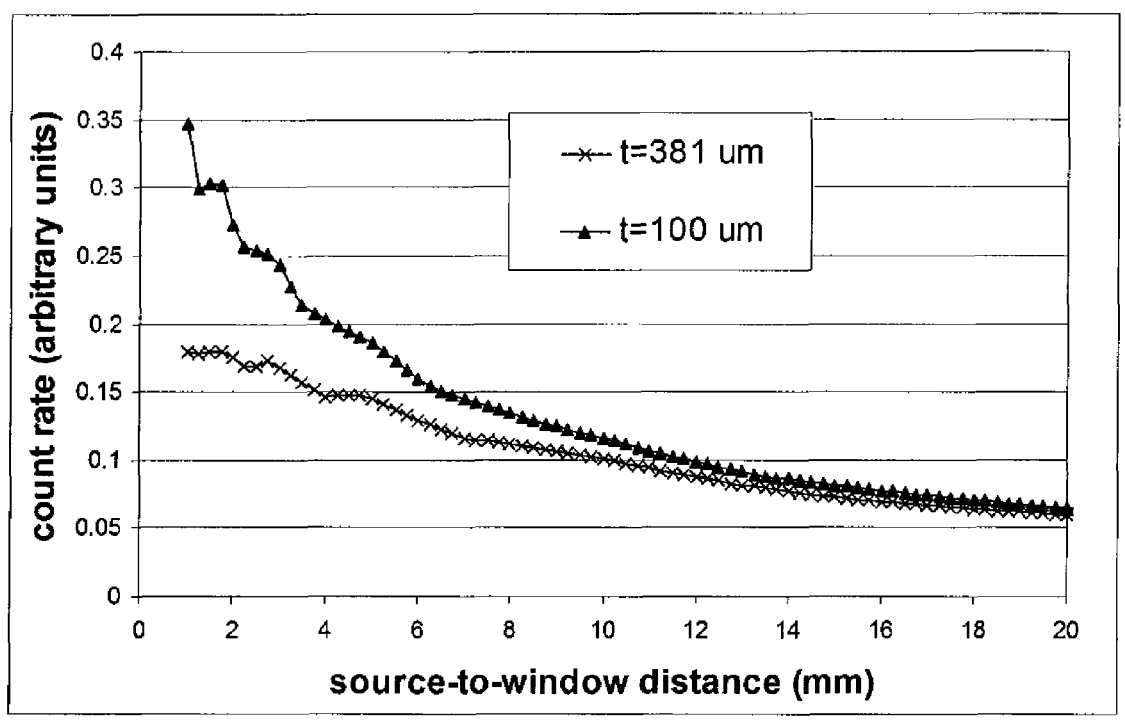
FIG. 5 is a plot from a model comparing the predicted radiation count rate of an X-ray detector behind a window with 381 µm-thick ribs and a window with 100 µm-thick ribs as a function of the fluoresced specimen distance to the window.

In addition to increasing the open area within the support frame 14, the arrangement of ribs 12 and openings 20 makes it possible to reduce the ribs' height, and thus the radiation collimation can be reduced to some degree. Collimation decreases radiation detector count rate and thus increases sampling time. X-rays that strike a rib are at least partially absorbed by the rib resulting in reduced detector efficiency as described above. If the rib height in the support frame is reduced, there is less chance of angled X-rays striking a rib's side. For this reason, a reduced-height rib causes less collimation. FIG. 3 and FIG. 4 illustrate the difference in window thickness of a thicker window (as shown in FIG. 3) and a thinner window (as shown in FIG. 4). FIG. 5 plots a model that compares the radiation count rate each detector (from FIG. 3 and FIG. 4) would receive as a function of radiation source 40 distance and window rib thickness. The model assumes that the rib structure absorbs any radiation striking it. As the radiation source's distance to the window decreases, the difference in count rate between the thicker and thinner windows becomes more pronounced.

Referring to FIG. 4, the window 10 can be part of a radiation detection system 30. The radiation detection system can include a high strength window for passing radiation 42 therethrough, which is described in detail in the embodiments set forth above. The radiation detection system 30 can include a sensor 44 located behind the window. The sensor can be configured to detect radiation 42 from a source 40 that passes through the window, and can further be configured to generate a signal based on the amount and/or type of radiation detected. The sensor 44 can be operatively coupled to various signal processing electronics.

A method of manufacturing a high strength grid for a window in a radiation detection system includes first forming a frame with an aperture and a plurality of silicon ribs spanning the aperture by growing an oxide layer on a bare silicon wafer by thermal oxidation. The oxide layer can then be patterned into the frame and plurality of silicon ribs by traditional lithography techniques. The frame and the plurality of ribs can be formed by anisotropic etching of a silicon wafer. Since the silicon etching rate along some particular planes of single-crystal silicon is much faster than other directions, the resulting silicon ribs have very flat side walls. As a result of the etching, the corners near the ends of those ribs and the edges between the top and bottom surfaces and side walls of the ribs can be very sharp and rough. The corners can be rounded and smoothed.

U.S. Pat. No. 4,960,486, which is incorporated herein by reference, discloses a method of manufacturing the silicon ribs, support structure, and overlaying the film. In embodiments of the present invention, the rib and frame coating processes would occur after etching but before dipping the rib or beam structure into a polymer solution.

Some of the coatings exhibit a large strength variation depending on how the coating is applied. In general, coatings may be strengthened through increased temperature, pressure, deposition time, and better surface preparation. For example, higher process temperatures provide greater mobility to the absorbed molecules and create denser films. However, if the temperature is too high, reactivity is decreased and the process may take longer than necessary. The pressure should be sufficiently high such that the surface becomes saturated with reactant preventing the chemical absorption or reaction process from being limited by lack of reactant. Deposition time should be sufficiently long to allow a more dense coating growth. Surfaces should be chemically clean through the use of etchants or plasma treatments to increase bonding strength.

The rib coating material 24 determines the specific coating process. Metal coatings such as aluminum, magnesium or beryllium are performed through e-beam evaporation under vacuum conditions or sputtering under the environment of an inert gas. A silicon dioxide coating is grown in a furnace purged with dry $O_2$, thereafter a bubbler with water provides moisture that produces a "wet" growth. Silicon nitride coatings are performed after removing the native oxide on the rib structure with a hydrofluoric acid dip. The window frames are inserted into a furnace that has been purged with dry nitrogen or ammonia. Boron coatings are applied in a furnace with diborane and argon gas using RF plasma. Methods for applying boron coatings are disclosed in U.S. Pat. No. 5,217,817, herein incorporated by reference. Diamond coatings are grown in a hydrocarbon gas atmosphere, preferably methane. Methods for applying diamond coatings are disclosed in U.S. Pat. Nos. 5,571,616 and 4,645,977, herein incorporated by reference. Methods for applying silicon carbide coatings are disclosed in U.S. Pat. Nos. 4,532,150 and 4,608,326, herein incorporated by reference. Boron Nitride coatings are performed through a reaction of ammonia and boron trichloride or ammonia and boron-containing gas as in disclosed in U.S. Pat. No. 4,957,773, herein incorporated by reference.

It is to be understood that the above-referenced arrangements are only illustrative of the application for the principles of the present invention. Numerous modifications and alternative arrangements can be devised without departing from the spirit and scope of the present invention. While the present invention has been shown in the drawings and fully described above with particularity and detail in connection with what is presently deemed to be the most practical and preferred embodiment(s) of the invention, it will be apparent to those of ordinary skill in the art that numerous modifications can be made without departing from the principles and concepts of the invention as set forth herein. Accordingly, it is not intended that the invention be limited, except as by the claims set forth below.

What is claimed is:

1. A window for a radiation detection system, the window comprising:
    a) a frame with an aperture therein configured to receive radiation therethrough;
    b) a plurality of silicon ribs spanning the aperture and carried by the frame;
    c) a coating substantially enveloping each of the plurality of silicon ribs; and
    d) a thin film covering the aperture and carried by the plurality of silicon ribs and configured to pass radiation therethrough.

2. A window as in claim 1, wherein a substantially coated silicon rib is stronger than an uncoated silicon rib.

3. A window as in claim 1, wherein the plurality of silicon ribs with a coating substantially enveloping each rib has an equal strength or a greater strength, and ribs with less cross section or fewer ribs, than a plurality of un-coated ribs with a greater number of ribs or wider cross section.

4. A window as in claim 1, wherein the coating surrounds a cross-sectional perimeter of the plurality of silicon ribs.

5. A window as in claim 1, wherein the plurality of silicon ribs has a height less than 100 µm.

6. A window as in claim 1, wherein the coating is low-atomic mass less than 28 grams/mol.

7. A window as in claim 1, wherein the coating is a low atomic mass element or compound selected from the group consisting of: Beryllium, Boron, Carbon, Magnesium, Aluminum, Diamond, Silicon Carbide, Boron Carbide, Boron Nitride, Silicon Nitride, and Beryllium Oxide.

8. A window as in claim 1, wherein the coating is at least partially diffused into each silicon rib.

9. A window as in claim 1, wherein each silicon rib is less than 100 µm wide.

10. A window as in claim 1, wherein each silicon rib is oriented parallel with respect to each other.

11. A window as in claim 1, wherein the plurality of upstanding silicon ribs includes a first set of parallel silicon ribs oriented non-parallel with respect to and intersecting a second set of parallel silicon ribs.

12. A window as in claim 1, wherein the film is polymeric.

13. A window as in claim 1, further comprising a gas barrier film layer disposed over the film.

14. A radiation detection system comprising:
    a) a window configured to pass radiation therethrough, the window comprising:
        i) a frame with an aperture therein configured to receive radiation therethrough;
        ii) a plurality of silicon ribs spanning the aperture and carried by the frame;
        iii) a coating substantially enveloping each of the plurality of silicon ribs; and
        iv) a thin film covering the aperture and carried by the plurality of silicon ribs and configured to pass radiation therethrough; and
    b) a sensor disposed behind the window configured to detect radiation passing through the window.

15. A method of making a window for a radiation detection system, the method comprising:
    a) forming a frame with an aperture and a plurality of silicon ribs spanning the aperture;
    b) coating the plurality of silicon ribs to form a plurality of coated silicon ribs;
    c) forming a thin film of material; and
    d) covering the aperture with the thin film wherein the thin film is secured on tops of the plurality of coated silicon ribs.

16. A method as in claim 15 wherein coating further comprises e-beam metal evaporation of a metal comprising one or more metal selected from aluminum, magnesium, or beryllium.

17. A method as in claim 15 wherein coating further comprises growing a silicon dioxide coating on the plurality of silicon ribs.

18. A method as in claim 15 wherein coating further comprises:
    a) removing a native oxide coating on the plurality of silicon ribs; and
    b) immersing the plurality of silicon ribs into a furnace purged with dry nitrogen or ammonia to form a silicon nitride coating on the plurality of silicon ribs.

19. A method as in claim 15 wherein coating further comprises:
    a) removing a native oxide coating on the plurality of silicon ribs; and
    b) immersing the plurality of silicon ribs into a furnace with a diborane gas, argon gas, and RF plasma to form a boron hydride coating on the plurality of silicon ribs.

* * * * *